US009594106B2

(12) United States Patent
Overton

(10) Patent No.: US 9,594,106 B2
(45) Date of Patent: Mar. 14, 2017

(54) TEST ARRANGEMENT

(71) Applicant: Viper Subsea Technology Limited, Bristol (GB)

(72) Inventor: Paul Robert Overton, Bristol (GB)

(73) Assignee: Viper Subsea Technology Limited, Bristol (GB)

( * ) Notice: Subject to any disclaimer, the term of this patent is extended or adjusted under 35 U.S.C. 154(b) by 0 days.

(21) Appl. No.: 14/586,167

(22) Filed: Dec. 30, 2014

(65) Prior Publication Data

US 2015/0198651 A1    Jul. 16, 2015

(30) Foreign Application Priority Data

Jan. 10, 2014    (GB) .................................. 1400402.2

(51) Int. Cl.
*G01R 31/11* (2006.01)
*G01R 31/14* (2006.01)
(Continued)

(52) U.S. Cl.
CPC ......... *G01R 31/025* (2013.01); *G01R 31/083* (2013.01)

(58) Field of Classification Search
CPC .... G01R 1/0416; G01R 1/06722; G01R 1/04; G01R 1/0466; G01R 1/07307; G01R 31/2601; G01R 31/2886; G01R 1/0408; G01R 1/07314; G01R 1/07342; G01R 31/2889; G01R 31/2893; G01R 31/311; G01N 2291/106; G01N 29/043; G01N 29/225; E21B 47/00; E21B 47/065; E21B 43/26; H04B 14/00; H04B 17/0082

USPC ...... 324/527, 437, 445, 446, 754.01–754.29, 324/755.01–759.03, 724, 715, 73.1, 500, 324/509, 522, 523, 525, 528, 530, 531, 324/532, 533, 534, 535, 555; 73/49.1, 73/49.2, 49.3, 49.5, 618, 622, 799; 166/336, 337, 338, 340, 250.01, 250.08; 367/13, 134

See application file for complete search history.

(56) References Cited

U.S. PATENT DOCUMENTS

2009/0229842 A1*  9/2009  Gray ................... H01M 2/1055
                                                          173/20
2011/0000677 A1*  1/2011  Overfield ............ E21B 33/0385
                                                          166/336

(Continued)

FOREIGN PATENT DOCUMENTS

EP    1536243 A1    6/2005
GB    2476152 A     6/2011

(Continued)

OTHER PUBLICATIONS

Search Report for GB1400402.2 dated Jul. 10, 2014.

*Primary Examiner* — Patrick Assouad
*Assistant Examiner* — Taqi Nasir

(57) ABSTRACT

A test arrangement for use in determining the location of a fault in an installation 10 comprising at least first and second conductors 22, 24 providing electrical connections between a surface located device 12 and a subsea located device 20, the test arrangement comprising a first module 26 operable to apply a common test signal between ground and the first and second conductors 22, 24, and a second module 28 operable to monitor the total current flowing through the first and second conductors 22, 24 at a subsea location.

14 Claims, 4 Drawing Sheets

(51) Int. Cl.
*G01R 31/02* (2006.01)
*G01R 31/08* (2006.01)

(56) References Cited

U.S. PATENT DOCUMENTS

| | | | |
|---|---|---|---|
| 2011/0298467 A1* | 12/2011 | Douglas | G01R 31/021 |
| | | | 324/509 |
| 2012/0001768 A1* | 1/2012 | Radosavljevic | H04Q 9/00 |
| | | | 340/870.03 |
| 2014/0021962 A1* | 1/2014 | Barnaby | G01R 31/025 |
| | | | 324/509 |

FOREIGN PATENT DOCUMENTS

| | | | | |
|---|---|---|---|---|
| GB | 2505559 A | 3/2014 | | |
| IT | EP 1536243 A1 * | 6/2005 | | G01R 31/021 |

* cited by examiner

TEST ARRANGEMENT

CROSS REFERENCE TO RELATED APPLICATION

The present application claims priority of British Patent Application 1400402.2, filed Jan. 10, 2014, the content of which is incorporated herein by reference in its entirety.

FIELD OF THE INVENTION

This invention relates to a test arrangement, and in particular to a test arrangement suitable for testing for earth leakage currents from a subsea installation.

BACKGROUND OF THE INVENTION

In subsea installations for use in, for example, controlling the extraction of oil or gas from subsea wells, it is usual for a surface located control station to communicate via an umbilical with a subsea located distribution unit which, in turn, communicates with a number of subsea located devices. The umbilical comprises a plurality of separate electrical power and communications lines. Depending upon the application in which the installation is used, the power lines may carry AC or DC supplies. It may also include hoses, fibre optic cables or the like. Power and communications signals may be transmitted between the surface location and the subsea located devices in this fashion. In some more complex architectures, additional distribution units may be provided between the primary distribution unit and the subsea located equipment.

In some arrangements, transformers may be present within the system, most typically within a distribution unit. Such transformers provide galvanic isolation and/or voltage transformation. However, transformers of this type are not always present.

The connections between the distribution unit or units and the subsea located equipment are typically made by the use of so-called jumpers. The jumpers typically comprise a plurality of electrical conductors for use in the transmission of power and communications signals. In addition, hoses or the like, or optical fibres, may also be present. Likewise, where additional distribution units are provided, similar jumpers or umbilicals may be used to provide the connections between the distribution units.

It is important for the electrical conductors of the umbilical, and the jumpers, in such arrangements to be electrically insulated from the sea water in which they are deployed. Failure of the insulation material can result in one or more of the conductors being shorted to ground, interfering with the operation or control of the subsea located equipment. The failure may arise from an impact, through gradual breakdown of the insulation or for other reasons.

In the event of such a failure, in order to identify the location of the fault it is usual for the entire installation to be powered down, and for a diver or ROV to be used to disconnect parts of the installation. Upon subsequent powering up of the remainder of the installation, if it is sensed that the short circuit has been alleviated then the operator will conclude that the fault lies within the part of the installation that has been disconnected. By repeated powering up and down, and disconnection and reconnection of parts of the installation, the location of the fault can be ascertained. Whilst this technique for identifying the location of a fault is useful, identification of the locations of faults in this manner is a time consuming and expensive operation. Furthermore, there is the risk that the disconnection and reconnection of parts of the installation may itself damage parts of the installation and so generate additional faults.

Whilst the description hereinbefore is concerned primarily with the detection of the location of faults arising from the failure of the insulation of an umbilical or jumper, the same technique can be used where the failure has occurred within a piece of subsea located equipment or within a distribution unit, or at a connection between an umbilical or jumper and a distribution unit or subsea device.

SUMMARY OF THE INVENTION

It is an object of the invention to provide a test arrangement whereby the location of a fault can be ascertained in a relatively quick and simple manner.

According to the present invention there is provided a test arrangement for use in determining the location of a fault in an installation comprising at least first and second conductors providing electrical connections between a surface located device and a subsea located device, the test arrangement comprising a first module operable to apply a common test signal between ground and the first and second conductors, and a second module operable to monitor the total current lowing through the first and second conductors at a subsea location.

The first module may be located at the surface, and the second module being adapted for use subsea. However, this need not always be the case and the first module could be adapted for use subsea, if desired.

The test signal conveniently takes the form of an AC test signal. However, there may be applications in which it is preferred to use a DC test signal.

By applying a common test signal to both the first conductor and the second conductor, there will normally be no leakage current between the first and second conductors. Accordingly, any current flow measured by the second module is indicative of an earth leakage current occurring downstream of the location of the second module arising through an insulation failure or the like. By adjusting the position of the second module and ascertaining the magnitude of any current flow, the location or locations of insulation faults or other faults giving rise to an earth leakage current can be ascertained.

The second module conveniently includes a probe forming a loop adapted to encircle the first and second conductors. The probe may include at least one moveable limb, moveable between a closed position in which the moveable limb and another limb together encircle the first and second conductors, and an open position. When in the open position, the first and second conductors can be introduced into or removed from the probe. In such an arrangement, when the probe occupies its closed position it defines a magnetic circuit encircling the conductors.

The probe is conveniently an inductive probe, operable to detect current flow within the first and second conductors.

The second module may include an internal power supply such as a battery. Alternatively it may be powered from an external source, for example by a cable link or from an ROV.

The second module may incorporate output means operable to output a signal to an operator in the event that a current is detected, thereby providing an indication that a fault condition has been detected and that the fault is located downstream of the location in which the second module is being used. If no current is detected, a signal may be output indicating that there is no earth leakage fault in the part of the system downstream of the location of the second module. The output(s) may be in the form of a simple LED. LCD display or the like. Alternatively, the output may be transmitted, for example wirelessly or via a suitable wired communications link, to a remote location. The output may be provided to the operator in real time.

As there is no need to disconnect parts of the subsea installation to identify the location of faults, the use of the invention to identify such locations is relatively simple and the risk of additional faults being caused is very low.

The invention further relates to a test module suitable for use in the test arrangement defined hereinbefore. The test module conveniently includes a probe forming a loop adapted to encircle at least one conductor. The probe may include at least one moveable limb, moveable between a closed position in which the moveable limb and a fixed limb together encircle the conductor, and an open position. When in the open position, the conductor can be introduced into or removed from the probe. When in the closed position, the limbs define a magnetic circuit.

According to another aspect of the invention there is provided a method of detecting the location of an insulation fault in an installation comprising at least first and second conductors providing electrical connections between a surface located device and a subsea located device, the method comprising applying a common test signal between ground and the first and second conductors at the surface, and monitoring the total current flowing through the first and second conductors at a subsea location.

The invention will further be described, by way of example, with reference to the accompanying drawings, in which:

DETAILED DESCRIPTION OF THE DRAWINGS

Figure 1:
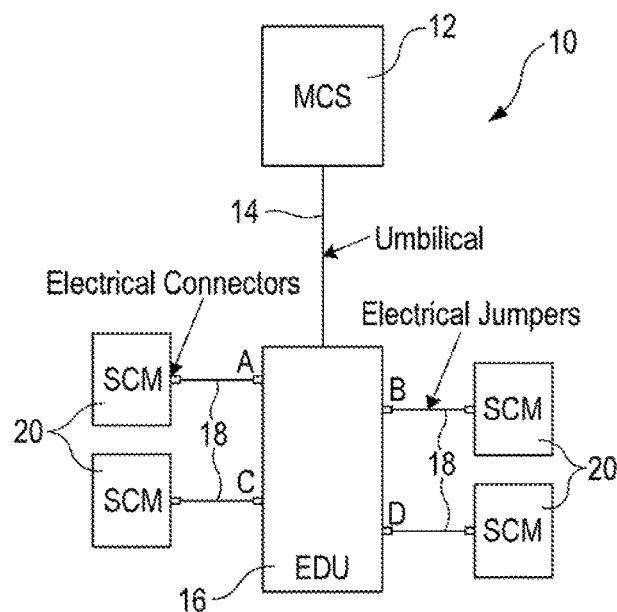
FIGS. 1 and 2 are diagrams illustrating subsea control arrangements.

Referring firstly to FIG. 1, part of a subsea production control installation or system 10 is illustrated, the system 10 comprising a surface device in the form of a topside located master control station 12 connected by way of an umbilical 14 to a subsea located distribution unit 16. The distribution unit 16 is connected, in turn, by way of jumpers 18, to subsea located devices or equipment in the form of control modules or devices 20.

The umbilical 14 comprises electrical cables serving as power cables and communications lines whereby power and signals can be transmitted between the station 12 and the distribution unit 16. Depending upon the nature and requirements of the devices 20, the umbilical 14 may also incorporate, for example, hoses or the like whereby fluids can be supplied. The umbilical 14 may be of length of from, for example, a few kilometers to around 100 km.

The services from the umbilical are typically separated at a distribution unit into hydraulic and electrical functions. The electrical functions are subsequently distributed via electrical flying leads 18 which serve to transmit power and signals between the distribution unit 16 and the devices 20. Depending upon the nature of the system 10, the electrical flying leads 18 may be of length between about 10 m and about 500 m.

It will be appreciated that in this fashion the various devices 20 may be powered and controlled from the station 12.

Figure 2:
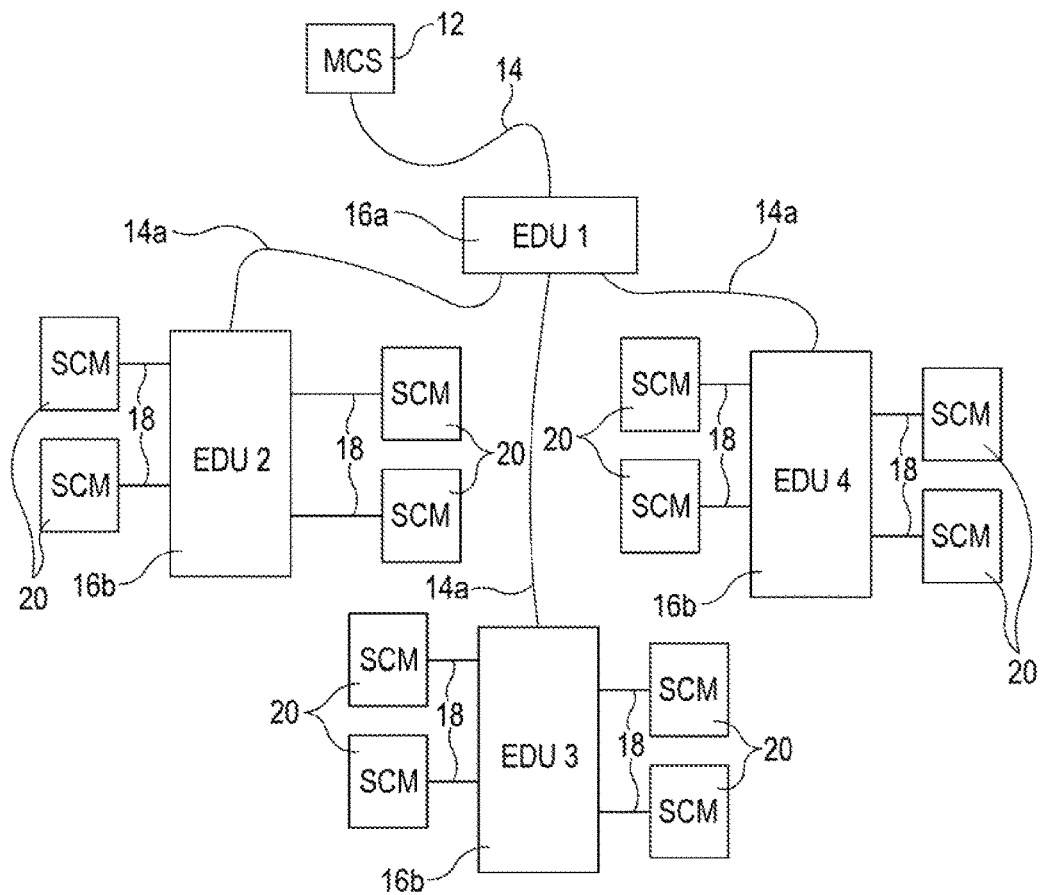

FIG. 2 illustrates a more complex system 10 in which the umbilical 14 connects the station 12 to a primary distribution unit 16a which, in turn, is connected by additional umbilicals 14a to secondary distribution units 16b. The secondary distribution units 18b are connected by way of electrical flying leads 18 to devices 20.

It will be appreciated that FIGS. 1 and 2 simply illustrate example systems and that systems 10 of a wide range of other forms are in use, and that the invention may be applied to any such system.

Systems of the type illustrated generally in FIGS. 1 and 2 are well known and so the nature and operation of the various component parts of the system 10 will not be described in further detail.

Figure 3:
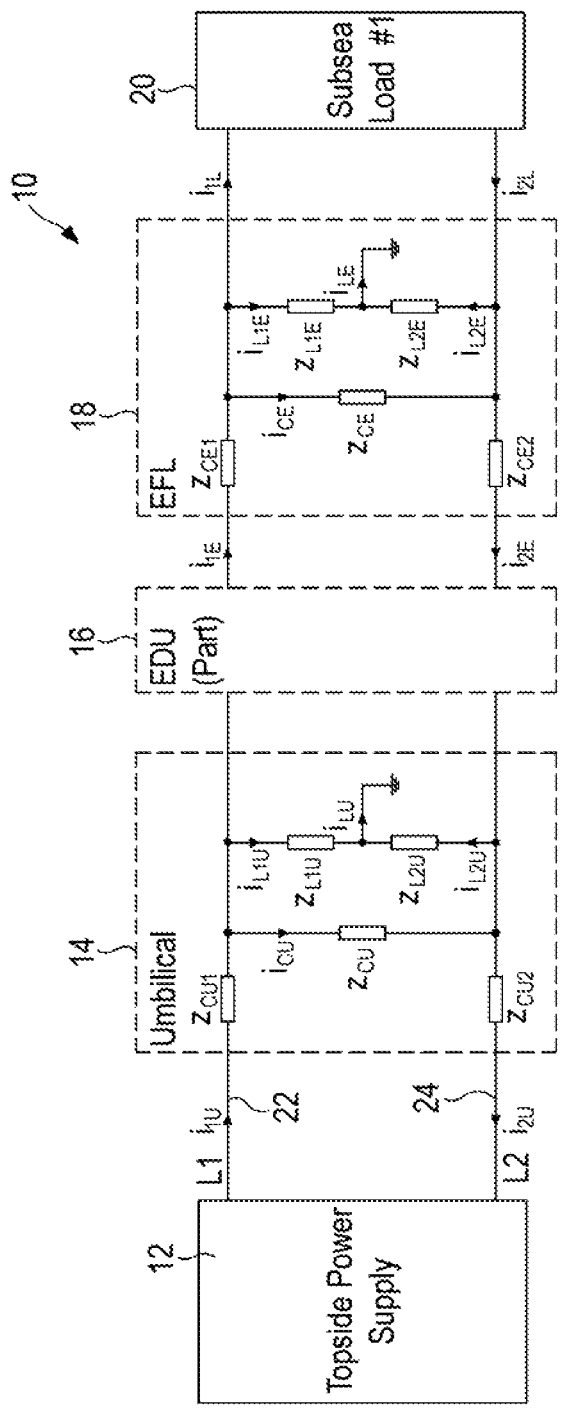
FIG. 3 is a diagram illustrating leakage impedances and currents associated with part of the arrangement of FIG. 1.

FIG. 3 is a circuit diagram illustrating part of the system of FIG. 1, illustrating the connection between the station 12 and one of the devices 20. As shown in FIG. 3, the umbilical 14, distribution unit 16 and electrical flying lead 18 define first and second conductors 22, 24 providing the electrical connections between the station 12 and the device 20. Whilst referred to herein as first and second conductors 22, 24, it will be appreciated that in practice, each of these conductors will be made up of a number of components or parts which may be directly electrically connected to one another or may be coupled to one another by, for example, connectors or the like.

FIG. 3 illustrates, diagrammatically, impedances associated with the parts of the conductors 22, 24 defined by parts of the umbilical 14 and the electrical flying lead 18. Accordingly. $Z_{CU1}$ and $Z_{CU2}$ represent the series impedances of the parts of the conductors 22, 24 defined by the umbilical 14, and $Z_{CE1}$ and $Z_{CE2}$ represent the series impedances of the parts of the conductors 22, 24 defined by the electrical flying lead 18. $Z_{LU}$ and $Z_{LE}$ represent the leakage impedances between the conductors 22, 24 within the umbilical 14 and electrical flying lead 18. $Z_{L1U}$ and $Z_{L2U}$ represent the leakage impedances between the conductors 22, 24 and ground within the umbilical 14, and $Z_{L1E}$ and $Z_{L2E}$ similarly represent the leakage impedances within the electrical flying 18. The electrical currents through each impedance are also identified in FIG. 3.

It will be appreciated that in the event of failure in the electrical insulation associated with one or other of the conductors 22, 24, the corresponding leakage impedance will reduce and the associated leakage current will rise. Depending upon the nature of the failure or fault, the current increase may result in a large, sudden increase in leakage current flow, or in a gradual rise in leakage current, for example arising from a gradual deterioration of the insulation.

Figure 4:
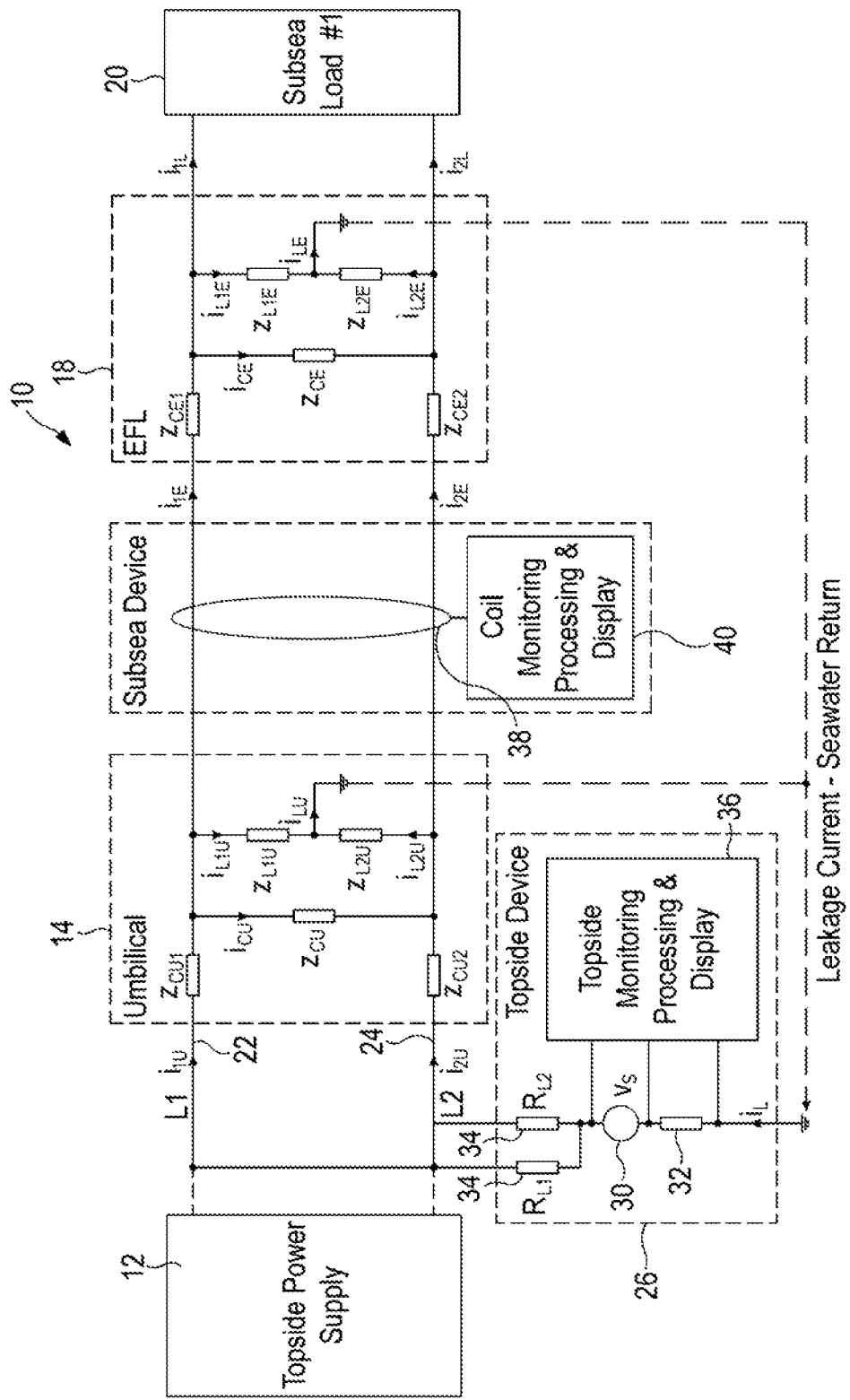
FIG. 4 illustrates the use of a test arrangement in accordance with an embodiment of the invention in identifying the location of an insulation fault in the arrangement of FIG. 3.

As shown in FIG. 4, a test arrangement in accordance with an embodiment of the invention comprises a first, surface module 26 and a second, subsea module 28. The surface module 26 is arranged to apply a common test signal, preferably an AC test signal, between ground and both of the conductors 22, 24. Accordingly, as illustrated in FIG. 4, the surface module 26 conveniently comprises an AC voltage source 30 connected, via resistors 32, 34, to ground and to both of the conductors 22, 24. A monitoring arrangement 36 controls and/or monitors the output of the source 30. By monitoring for current flowing within the conductors 22, 24, it can be determined whether or not there is an earth leakage within the system 10 as a whole. It will be appreciated that this is merely one embodiment, and that a number of other configurations are possible without departing from the invention.

It will be appreciated that as the same test signal is applied to both of the conductors 22, 24, provided the conductor impedances of the umbilical are equal to one another (as will normally be the case) and the electrical flying lead conductor impedances are equal to one another (as, again, will normally be the case) there will be no leakage between the conductors 22, 24 as the conductors will be at equal potentials. Accordingly, any current flowing within the conductors 22, 24 is indicative of an earth leakage occurring downstream of the location at which the current has been sensed.

The subsea module 28 is adapted to allow an operator to test various locations of the system 10 to identify whether or not there is a current flowing at that location, and hence to determine whether or not there is an earth leakage in the part of the system 10 downstream of that location.

Figure 5:
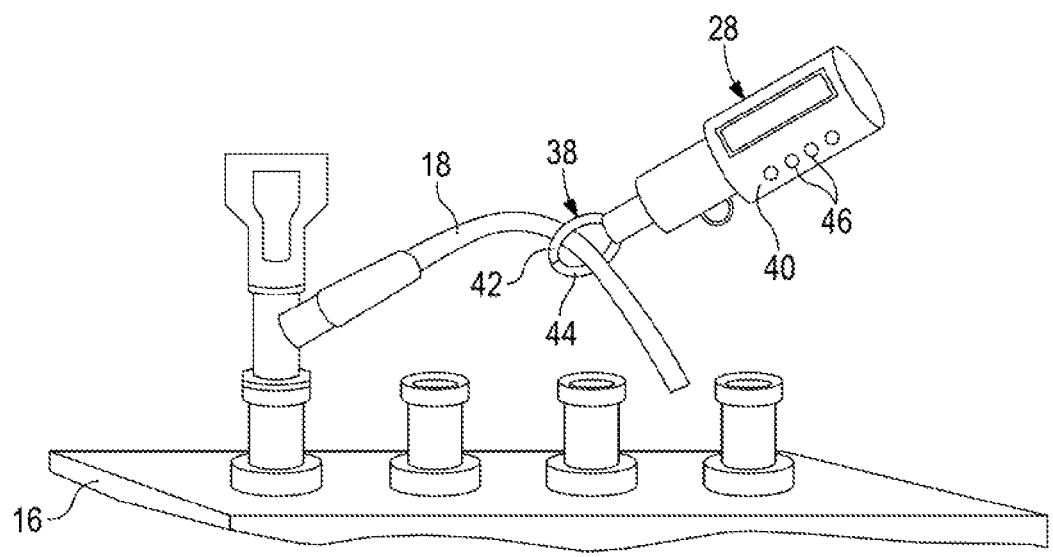
FIG. 5 is an illustration of part of the test arrangement of FIG. 4.

In this embodiment the subsea module 28 comprises a probe including an inductive loop 38 which, in use, encircles the conductors 22, 24, and a monitoring device 40 connected to the loop 38. As shown in FIG. 5, in order to allow the subsea module 28 to be moved to the various parts of the system 10 during the testing operation, the loop 38 is conveniently defined by a pair of limbs 42, 44, at least one of which is moveable between an open position in which the umbilical 14 or electrical flying lead 18 containing the conductors 22, 24 at the location to be tested can be introduced into the loop 38 and a closed position in which the loop 38 fully encircles the conductors 22, 24.

It will be appreciated that, in use, with the loop 38 encircling the conductors 22, 24, a current flowing in the part of one or other of the conductors 22, 24 located within the loop 38 will result in the generation of an electromagnetic field which, in turn will generate an electrical current in the loop 38 which can be sensed by the monitoring device 40. Depending upon whether or not a current is detected in the conductors 22, 24, one or other of a series of indicator lights or LEDs 46 will be illuminated, providing an indication to an operator of whether a current flow has been sensed, and hence of whether a fault is present downstream of the location in which the subsea module has been used. Of course, other techniques for outputting information to the operator are possible without departing from the invention. For example, a readout or display may provide an indication of the magnitude of the sensed current. Alternatively, the output may be transmitted to a remote location, for example at the surface or to an ROV. The transmission could be a wireless transmission or alternatively could be by way of a wired communications link. Examples include 4-20 mA communications links, serial communications links, Ethernet based interfaces or via a downline. Other transmissions techniques could be used to transmit the output to a remote location, for example transmitting signals through water using laser or radio frequency based means. It will be appreciated that the invention is not restricted in this regard.

The subsea module 28 conveniently includes an internal power source or battery. However, this need not always be the case and alternative power sources may be used. For example, it could be powered from an ROV or be connected to the surface by a cable.

In use, therefore, in order to undertake an insulation integrity or earth leakage test upon a system, the umbilical 14 is electrically isolated from the station 12 so that the umbilical 14 and components connected thereto are no longer powered or in communication with the station 12. Instead, the umbilical 14 is connected to the surface module 26. It will be appreciated that although FIG. 4 suggests that the umbilical 14 is physically disconnected from the station 12, the disconnection or isolation could be achieved by appropriate control over switches or the like if desired.

As the station 12 is surface located, it will be appreciated that disconnection and reconnection thereof is unlikely to cause the generation of a fault.

With the umbilical 14 connected to the surface module 26, the surface module 26 is operated to inject a test AC signal between ground and the first and second conductors 22, 24. The monitoring arrangement 36 monitors for current flow within the conductors 22, 24 if no current is detected, then this provides an indication that there is no earth leakage. If an earth leakage current is detected, then the location of the fault can be determined by the use of the subsea module. As mentioned before, by applying a common test signal to both conductors 22, 24, leakage therebetween is avoided.

The operator (or an ROV) operates the subsea module 28 to open the limbs of the loop 38, introduces the part of the electrical flying lead 18 at the location of the subsea module 28 into the loop 38, and then closes the limbs of the loop 38 such that the conductors 22, 24 are encircled by the loop 38. The monitoring device 40 then outputs a signal indicative of whether current flow is present within the part of the electrical flying lead 18 located within the loop 38. If no current flow is detected, then this indicates that there is no leakage current from the parts of the system downstream of the subsea module 28. Thus, if the operator tests the system 10 at location A marked on FIG. 1 and finds that no current is flowing, he knows that the electrical flying lead 18 and device 20 connected to the distribution unit 16 at location A are operating correctly. He can then remove the subsea module 28 and move it to another location, say location B and repeat the test. If the test shows that there is a current flowing, then this indicates that there is a fault in the electrical flying lead 18 or device 20 connected to location of the subsea module. Movement of the subsea module 28 along the electrical flying lead 18 can allow the location of the fault on the electrical flying lead 18 to be detected. If the end of the electrical flying lead 18 connected to the device 20 is reached and current is still being detected, then this would indicate that the fault lies within the device 20. It will be appreciated that by moving the subsea module 28 to various locations, faults associated with the umbilical 14, electrical flying leads 18 and other parts of the system can be detected.

By comparing the magnitude of the leakage current observed at each location with the total leakage current observed by the surface module, it will be appreciated that the user can ascertain whether there is just one fault or several faults, and the location of each fault can be identified.

It will be appreciated that the use of the test arrangement described hereinbefore allows the detection of the location of earth leakage faults to be detected relatively simply and quickly. There is no need to repeatedly disconnect and reconnect parts of the system under test, and powering down and up of the system. The risk of the test procedure itself introducing additional faults into the system is thus reduced.

Although the subsea module of the arrangement described hereinbefore makes use of an inductive loop in detecting the presence of a current flowing through the parts of the conductors encircled by the loop, it will be appreciated that other techniques for sensing the presence of a current could be used. By way of example, by modification of the surface module 26 to apply a DC test signal to conductors 22, 24, the magnetic field associated with the presence of a current at the location of the subsea module 28 could be sensed using a subsea module including a Hall effect based sensor probe.

Whilst in the arrangement outlined hereinbefore a common test signal is applied to both conductors, there may be circumstances in which it is desired to apply a test signal to just one of the conductors, use of the subsea module allowing current leakage associated with that one of the conductors to be sensed. When used in this manner, it will be appreciated that the current sensed by the subsea module may be indicative of both earth leakage currents and leakages between the conductors. By way of example, if the test signal were cycled between being applied to the first conductor and the second conductor, and if the subsea module were synchronised to the cycling of the application of the test signals, the test apparatus could be used to identify which of the conductors has a fault associated therewith. Likewise, it may be possible to use the subsea module to detect the location of faults with the installation still powered. By way of example, this may be achieved by using the subsea module to detect an actual current at a location and comparing the actual current with an expected current level to identify whether or not there is a fault downstream of the location.

Although the embodiments described hereinbefore refer to a first, surface module and a second, subsea module, it will be appreciated that in some circumstances it may be desired for both modules to be located subsea. By way of example, if the umbilical 14 is of great length, it may be preferred for the test signal to be injected at a location closer to the potential fault location than is possible with the first module located at the surface, in which case the first module may be located at or close to the distribution unit 16.

Whilst specific embodiments of the invention are described hereinbefore, it will be appreciated that a wide range of modifications and alterations may be made thereto without departing from the scope of the invention. By way of example, if the system were a three phase system then by modification of the surface module 26 to apply the same test signal to first, second and third conductors of the system, the test arrangement may be used in substantially the manner described hereinbefore to identify the presence of and location of faults. Other modifications and alterations are also possible.

The invention claimed is:

1. A test arrangement for use in determining the location of a fault in an installation comprising at least first and second conductors providing electrical connections between a surface located device and a subsea located device, the test arrangement comprising a first module operable to apply a common AC test signal between ground and the first and second conductors, and a second module operable to monitor the total current flowing through the first and second conductors at a subsea location, the second module being movable to allow monitoring of the total current flowing through the first and second conductors at a plurality of subsea locations, wherein the second module includes a probe defining a loop adapted to encircle the first and second conductors, wherein the probe includes at least one moveable limb, wherein the probe is moveable between a closed position in which the moveable limb and another limb together define the loop encircling both the first and second conductors, and an open position.

2. An arrangement according to claim 1, wherein when in the open position, the first and second conductors can be introduced into or removed from the probe.

3. An arrangement according to claim 1, wherein the probe operates inductively to detect current flow within the first and second conductors.

4. An arrangement according to claim 3, wherein the probe comprises a magnetically coupled loop.

5. An arrangement according to claim 1, wherein the second module includes an internal power supply.

6. An arrangement according to claim 1, wherein the second module is adapted to be powered from an external source.

7. An arrangement according to claim 1, wherein the second module incorporates output means operable to output a signal to an operator in the event that a current is detected, thereby providing an indication that a fault condition has been detected and that the fault is located downstream of the location in which the second module is being used.

8. An arrangement according to claim 7, wherein the output means provides a visual indication to the operator.

9. An arrangement according to claim 7, wherein the output means includes communication means whereby the signal is transmitted to a remote location.

10. A sensor module adapted for use in a test arrangement for use in determining the location of a fault in an installation comprising at least first and second conductors providing electrical connections between a surface located device and a subsea located device, the test arrangement comprising a first module operable to apply a common AC test signal between ground and the first and second conductors, the sensor module being operable to monitor the total current flowing through the first and second conductors at a subsea location, the sensor module being movable to allow monitoring of the total current flowing through the first and second conductors at a plurality of subsea locations, the sensor module comprising a probe defining a loop adapted to encircle both of the at least first and second conductors, wherein the probe includes at least one moveable limb, wherein the probe is moveable between a closed position in which the moveable limb and another limb together define the loop encircling the conductor, in use, and an open position.

11. A module according to claim 10, wherein when in the open position, the conductor can be introduced into or removed from the probe.

12. A module according to claim 10, wherein when in the closed position, the limbs define a magnetic circuit.

13. A method of detecting the location of an insulation fault in an installation comprising at least first and second conductors providing electrical connections between a surface located device and a subsea located device, the method comprising the steps of:

applying a common AC test signal between ground and the first and second conductors; and monitoring the total current flowing through the first and second conductors at a subsea location using a sensor module, the sensor module being movable to allow monitoring of the total current flowing through the first and second conductors at a plurality of subsea locations, wherein the sensor module comprising a probe defining a loop adapted to encircle both of the at least first and second conductors, wherein the probe includes at least one moveable limb, wherein the probe is moveable between a closed position in which the moveable limb and another limb together define the loop encircling the conductor, in use, and an open position.

14. A method according to claim 13, wherein if no current flow is detected by the sensor module, an indication is output that there is no leakage current from the parts of the installation downstream of the subsea location at which the sensor module is located.

* * * * *